US011441636B2

(12) United States Patent
Hsiao et al.

(10) Patent No.: US 11,441,636 B2
(45) Date of Patent: Sep. 13, 2022

(54) BEARING ASSEMBLY

(71) Applicants:Inventec (Pudong) Technology Corporation, Shanghai (CN); INVENTEC CORPORATION, Taipei (TW)

(72) Inventors: Chi-Cheng Hsiao, Taipei (TW); Ying-Chao Peng, Taipei (TW); Chun-Ying Yang, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 273 days.

(21) Appl. No.: 16/902,610

(22) Filed: Jun. 16, 2020

(65) Prior Publication Data

US 2021/0381578 A1 Dec. 9, 2021

(30) Foreign Application Priority Data

Jun. 5, 2020 (CN) .......................... 202010507165.3

(51) Int. Cl.
*F16F 15/02* (2006.01)
*F16F 1/36* (2006.01)
(Continued)

(52) U.S. Cl.
CPC ............ *F16F 15/02* (2013.01); *F16F 1/3735* (2013.01); *H05K 5/0073* (2013.01);
(Continued)

(58) Field of Classification Search
CPC ........ F16F 1/3735; F16F 3/0873; F16F 15/02; F16F 2228/06; F16F 2230/36; H05K 5/0073; H05K 5/0204; B60G 2204/128
See application file for complete search history.

(56) References Cited

U.S. PATENT DOCUMENTS

| 7,416,174 | B2 * | 8/2008 | Dickson | .................. | F16F 3/093 |
| | | | | | 267/141.1 |
| 8,226,066 | B2 * | 7/2012 | Kubat | ..................... | F16F 3/093 |
| | | | | | 267/293 |

(Continued)

FOREIGN PATENT DOCUMENTS

| CN | 201878488 U | * | 6/2011 | |
| JP | 5757283 B2 | * | 7/2015 | ............... B60K 1/00 |

*Primary Examiner* — Adam D Rogers
(74) *Attorney, Agent, or Firm* — Locke Lord LLP; Tim Tingkang Xia, Esq.

(57) ABSTRACT

A bearing assembly configured to be disposed on casing of electronic device and including plate body, first damping component, second damping component, first fastener and second fastener. The plate body includes first mounting hole and second mounting hole. The first damping component is disposed in the first mounting hole. The first damping component includes first hole. The second damping component is disposed in the second mounting hole. The second damping component includes second hole. The first fastener is disposed in the first hole of the first damping component and configured to be fixed to the casing of the electronic device. The second fastener is disposed in the second hole of the second damping component and configured to be fixed to the casing of the electronic device. A hardness of the first damping component is greater than a hardness of the second damping component.

9 Claims, 4 Drawing Sheets

(51) Int. Cl.
*H05K 5/02* (2006.01)
*H05K 5/00* (2006.01)
*F16F 1/373* (2006.01)
*F16F 3/087* (2006.01)

(52) U.S. Cl.
CPC ..... *H05K 5/0204* (2013.01); *B60G 2204/128* (2013.01); *F16F 3/0873* (2013.01); *F16F 2228/06* (2013.01); *F16F 2230/36* (2013.01)

(56) References Cited

U.S. PATENT DOCUMENTS

| | | | |
|---|---|---|---|
| 8,511,656 B2* | 8/2013 | Yahata | F16F 1/3863 |
| | | | 248/635 |
| 11,332,089 B2* | 5/2022 | Hsiao | B60R 16/0239 |
| 2020/0271182 A1* | 8/2020 | Hugenschmidt | F16F 15/08 |
| 2021/0380052 A1* | 12/2021 | Hsiao | H05K 7/1412 |
| 2022/0159850 A1* | 5/2022 | Hsiao | H05K 5/0073 |

* cited by examiner

BEARING ASSEMBLY

CROSS-REFERENCE TO RELATED APPLICATIONS

This non-provisional application claims priority under 35 U.S.C. § 119(a) on Patent Application No(s). 202010507165.3 filed in China, on Jun. 5, 2020, the entire contents of which are hereby incorporated by reference.

BACKGROUND OF THE INVENTION

Technical Field of the Invention

The invention relates to a bearing assembly, more particularly to a bearing assembly including at least one damping component.

Description of the Related Art

In general, there are undulations in the road surface, and when the vehicle travels over undulations in the road surface, an impact and a resonance vibration may occur in the vehicle casing. The impact has larger amplitude and lasts for a short time while the resonance vibration has smaller amplitude and lasts for a long time. Also, vehicle computer or vehicle server is fixed to the vehicle casing via a plurality of screws. Thus, when the aforementioned impact and resonance vibration occur in the vehicle, such impact and resonance vibration would be further transferred to the vehicle computer or vehicle server via the screws.

However, traditional damping configuration disposed on the screws is simple, and thus is unable to effectively absorb both of the aforementioned impact and resonance vibration. In this way, such impact and resonance vibration may affect the operation of the vehicle computer or the vehicle server.

SUMMARY OF THE INVENTION

The invention is to provide a bearing assembly allowing both of the impact and the resonance vibration occurring in the casing fixed to the bearing assembly to be effectively absorbed.

One embodiment of this invention provides a bearing assembly configured to be disposed on a casing of an electronic device and including a plate body, a first damping component, a second damping component, a first fastener and a second fastener. The plate body includes a first mounting hole and a second mounting hole. The first damping component is disposed in the first mounting hole. The first damping component includes a first hole. The second damping component is disposed in the second mounting hole. The second damping component includes a second hole. The first fastener is disposed in the first hole of the first damping component and configured to be fixed to the casing of the electronic device. The second fastener is disposed in the second hole of the second damping component and configured to be fixed to the casing of the electronic device. A hardness of the first damping component is greater than a hardness of the second damping component.

According to the bearing assembly disclosed by above embodiments, the first fastener and the second fastener are fixed to the casing of the electronic device and are respectively disposed in the first mounting hole and the second mounting hole of the plate body, the first damping component and the second damping component are respectively disposed in the first mounting hole and the second mounting hole of the plate body, and the hardness of the first damping component is different from the hardness of the second damping component. Thus, with the help of the first damping component, the resonance vibration transferred to the electronic device via the first fastener and the second fastener can be effectively absorbed. Also, with the help of the second damping component whose hardness is different from the hardness of the first damping component, the impact transferred to the electronic device via the first fastener and the second fastener can be effectively absorbed. Therefore, the operation of the electronic device is prevented from being affected by such impact and resonance.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
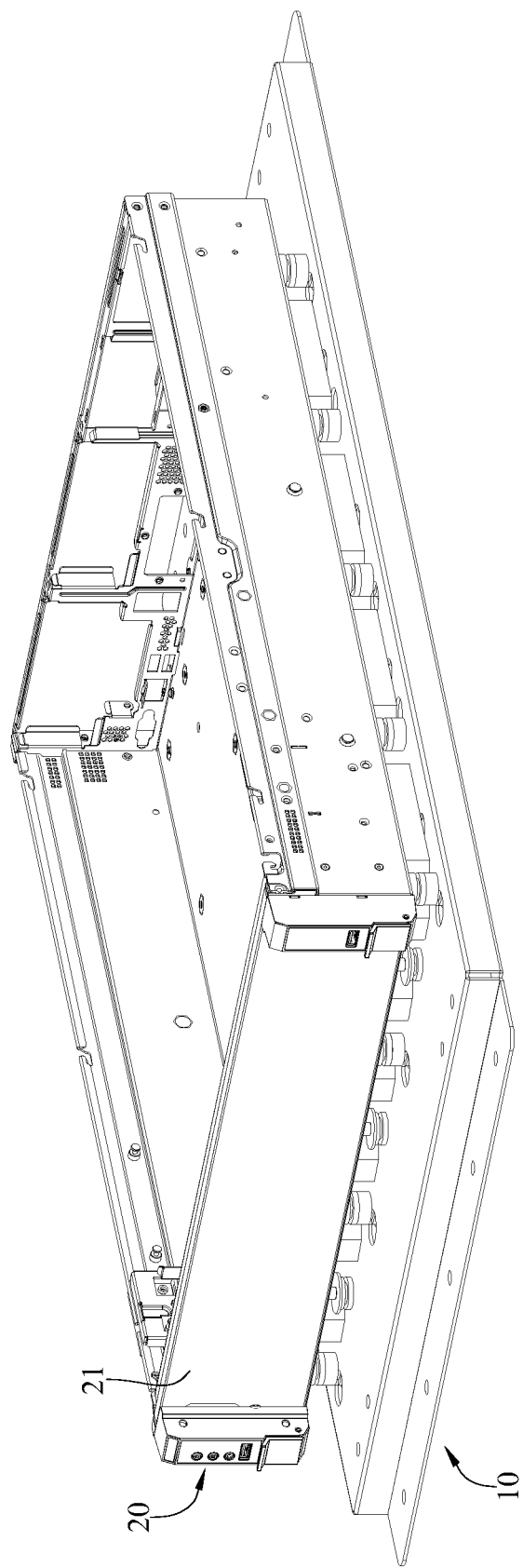
FIG. 1 is a perspective view of a bearing assembly according to an embodiment of the invention and an electronic device.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
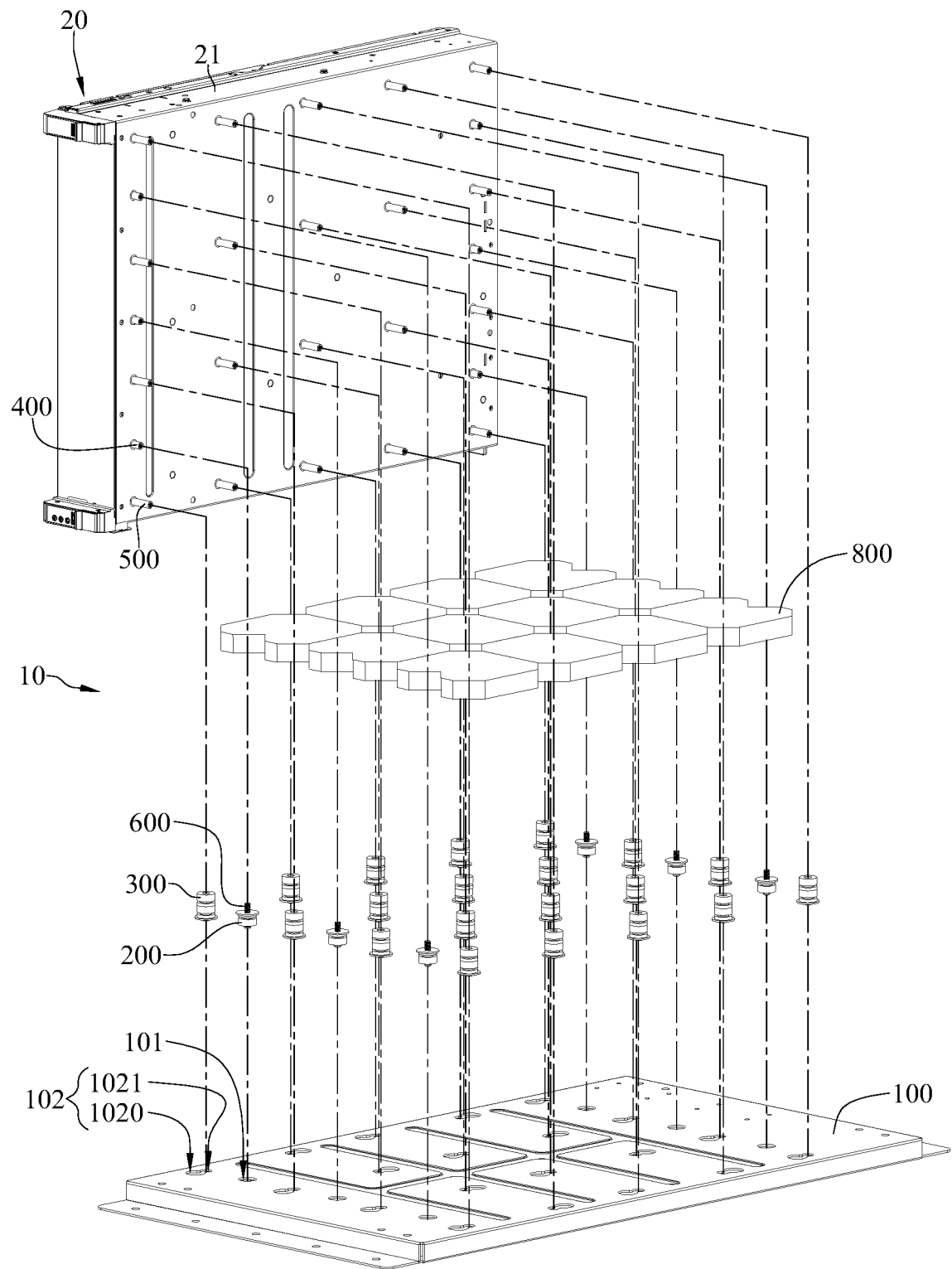
FIG. 2 is an exploded view of the electronic device and the bearing assembly in FIG. 1.
Figure 3:
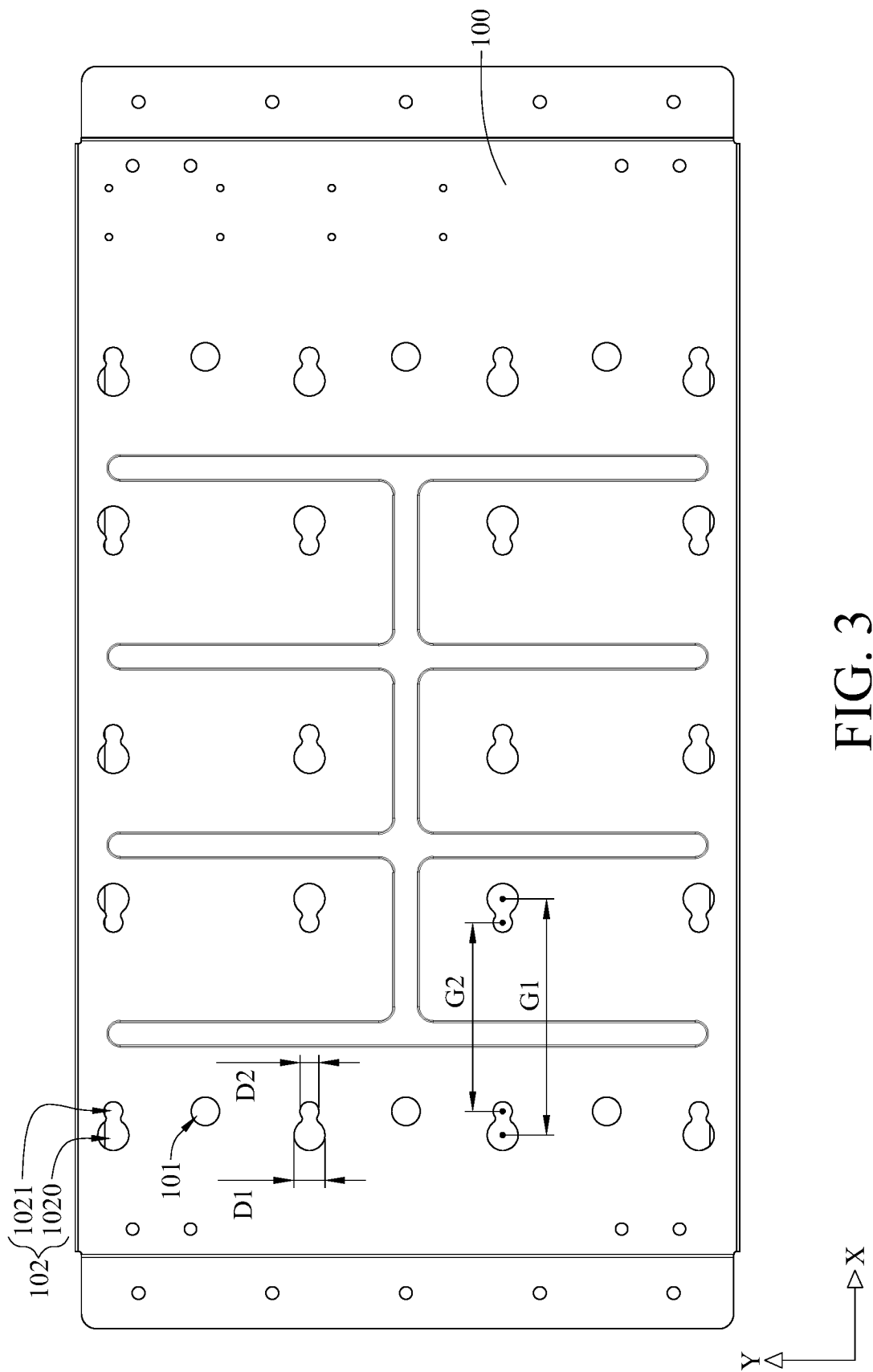
FIG. 3 is a top view of a plate body of the bearing assembly in FIG. 1.
Figure 4:
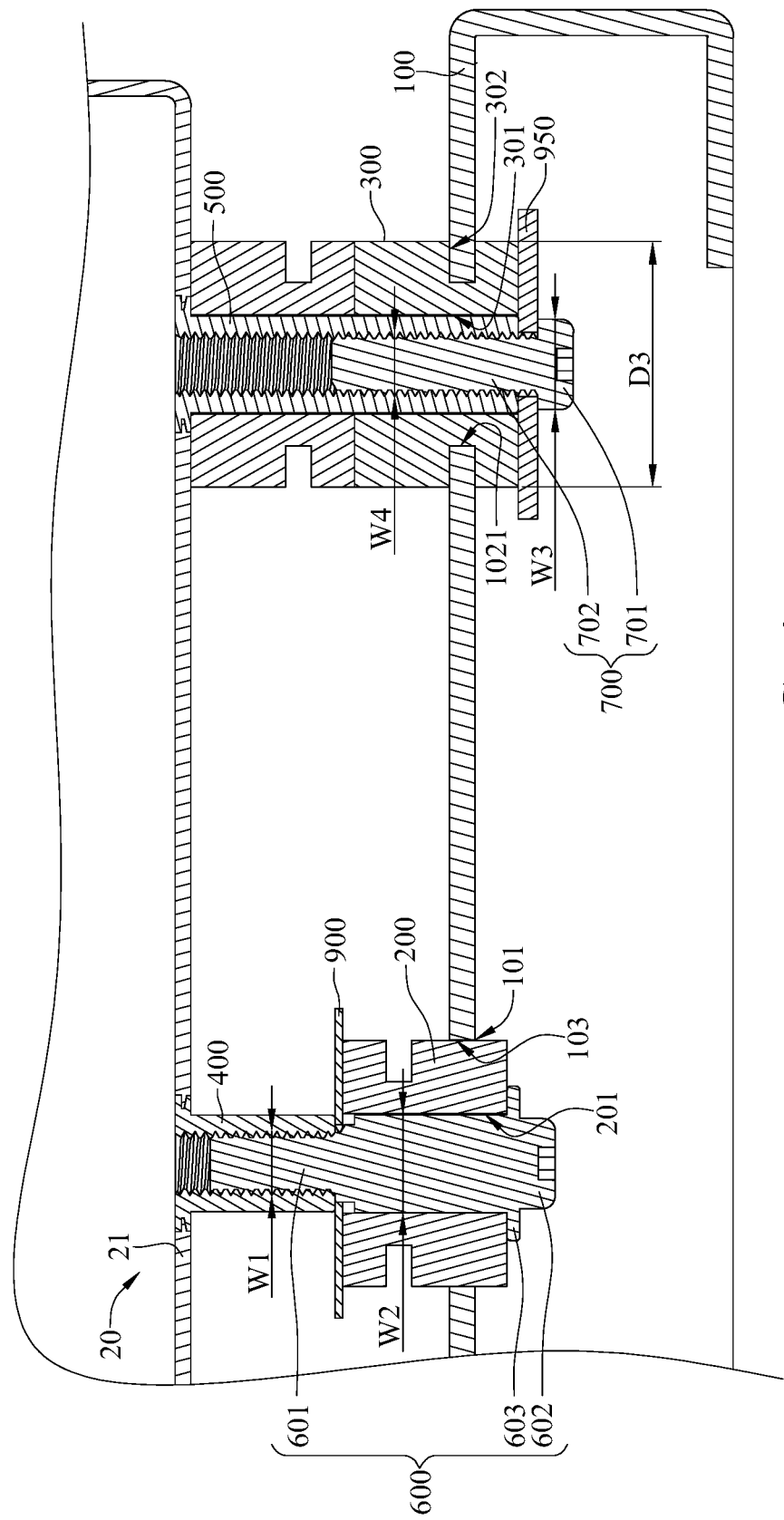
FIG. 4 is a partially enlarged side cross-sectional view of the electronic device and the bearing assembly in FIG. 1.

Please refer to FIG. 1 to FIG. 4, where FIG. 1 is a perspective view of a bearing assembly according to an embodiment of the invention and an electronic device, FIG. 2 is an exploded view of the electronic device and bearing assembly in FIG. 1, FIG. 3 is a top view of a plate body of the bearing assembly in FIG. 1, and FIG. 4 is a partially enlarged side cross-sectional view of the electronic device and the bearing assembly in FIG. 1.

In this embodiment, a bearing assembly 10 is configured to be disposed on a casing 21 of an electronic device 20, where the electronic device 20 is, for example, a vehicle computer. In this embodiment, the bearing assembly 10 includes a plate body 100, a plurality of first damping components 200, a plurality of second damping components 300, a plurality of first positioning pillars 400, a plurality of second positioning pillars 500, a plurality of first fasteners 600, a plurality of second fasteners 700, a damping pad 800, a plurality of first pads 900 and a plurality of second pads 950.

The plate body 100 is disposed in, for example, a rear compartment. That is, the electronic device 20 is disposed in the rear compartment via, for example, the bearing assembly 10. In this embodiment, the plate body 100 includes a plurality of first mounting holes 101 and a plurality of second mounting holes 102. In this embodiment, the first mounting holes 101 are, for example, cylindrical through holes and the second mounting holes 102 are, for example, pear-shaped through holes, but the invention is not limited thereto. In other embodiments, the first mounting holes and the second mounting holes may both be cylindrical through holes or both be pear-shaped through holes.

As shown in FIG. 3, in this embodiment, the second mounting holes 102 are arranged side by side in an array, the first mounting holes 101 are respectively located between two adjacent rows of the second mounting holes 102 arranged along X-axis, and the first mounting holes 101 are respectively arranged side by side in the two outermost columns of the second mounting holes 102 arranged along Y-axis.

In addition, each second mounting hole 102 includes a wider portion 1020 and a narrower portion 1021 that are connected to each other, where a diameter D1 of the wider portion 1020 is greater than a diameter D2 of the narrower portion 1021. With respect to the two adjacent second mounting holes 102 that are arranged along X-axis, a distance G1 between their two wider portions 1020 is different from a distance G2 between their two narrower portions 1021. That is, the second mounting holes 102 are arranged along X-axis in an opposite manner, thereby improving the capability for the second mounting holes 102 to absorb the vibration occurring along X-axis. However, in other embodiments, with respect to the two adjacent second mounting holes that are arranged along X-axis, the distance between their two wider portions may be equal to the distance between their two narrower portions.

Please refer to FIGS. 2 to 4, the first damping components 200 are respectively disposed in the first mounting holes 101 and each include a first hole 201.

The second damping components 300 are respectively disposed through the narrower portions 1021 of the second mounting holes 102 and each include a second hole 301, and a maximum diameter D3 of the second damping components 300 is between a diameter D1 of the wider portion 1020 and a diameter D2 of the narrower portion 1021. In addition, the hardness of the first damping components 200 is greater than the hardness of the second damping components 300. For example, the Young's modulus of the first damping components 200 is greater than the Young's modulus of the second damping components 300. Thus, when an identical amount of stress is applied to the first damping components 200 and the second damping components 300, the deformation of the first damping components 200 is less than the deformation of the second damping components 300.

Moreover, in this embodiment, each second damping component 300 further includes an engagement recess 302. The engagement recess 302 is spaced apart from the second hole 301, and the plate body 100 is engaged with the engagement recess 302. However, in other embodiments, the second damping component may not include the engagement recess 302 and may be engaged with the second mounting hole of the plate body via press-fit.

The first positioning pillars 400 are respectively disposed in the first holes 201 of the first damping components 200, and the second positioning pillars 500 are respectively disposed in the second holes 301 of the second damping components 300. The first positioning pillars 400 and the second positioning pillars 500 are configured to be fixed to the casing 21 of the electronic device 20.

The first fasteners 600 are, for example, stepped screws, and each include a threaded portion 601 and a unthreaded portion 602. As shown in FIG. 4, the threaded portion 601 is connected to the unthreaded portion 602 and a width W1 of the threaded portion 601 is less than a width W2 of the unthreaded portion 602. The threaded portion 601 is screwed into the first positioning pillar 400, and the first damping component 200 is clamped by the unthreaded portion 602 and a wall surface 103 of the plate body 100 that forms the first mounting hole 101. In other words, the first positioning pillar 400 is disposed in the first hole 201 of the first damping component 200 via the first fastener 600.

Moreover, the first positioning pillars 400 are optional. In other embodiments, the bearing assembly may not include the first positioning pillar 400 and the first fastener is directly disposed in the first hole of the first damping component and fixed to the casing of the electronic device.

As shown in FIG. 4, the second fastener 700 includes a head part 701 and a body part 702 that are connected to each other, and a width W3 of the head part 701 is greater than a width W4 of the body part 702, where the body part 702 is screwed into the second positioning pillar 500.

However, the second positioning pillars 500 are optional. In other embodiments, the bearing assembly may not include the second positioning pillars 500 and the second fastener is directly disposed in the second hole of the second damping component and fixed to the casing of the electronic device.

As shown in FIG. 2, the damping pad 800 is stacked on the plate body 100 and is configured to be located between the casing 21 of the electronic device 20 and the plate body 100. The hardness of the damping pad 800 is less than the hardness of the first damping components 200, but the invention is not limited thereto. In other embodiments, the hardness of the damping pad may be greater than or equal to the hardness of the first damping component. Also, in other embodiments, the bearing assembly may not include the damping pad 800.

As shown in FIG. 4, the first pad 900 is clamped by the unthreaded portion 602 and the first positioning pillar 400. As shown in FIG. 4, the first fastener 600 further includes a blocking portion 603, where the blocking portion 603 radially protrudes from the unthreaded portion 602 and the first damping component 200 is clamped by the first pad 900 and the blocking portion 603, but the invention is not limited thereto. In other embodiments, the bearing assembly may not include the first pad 900, the first fastener may not include the blocking portion 603, and the unthreaded portion of the first fastener directly rests on the first positioning pillar.

As shown in FIG. 4, the second pad 950 is clamped by the head part 701 of the second fastener 700 and the second positioning pillar 500, but the invention is not limited thereto. In other embodiments, the bearing assembly may not include the second pad 950 and the head part of the second fastener directly rests on the second positioning pillar.

In this embodiment, the impact occurring in the casing 21 of the electronic device 20 is mainly absorbed by the first damping components 200 and the damping pad 800, and the resonance vibration occurring in the casing 21 of the electronic device 20 is mainly absorbed by the second damping components 300.

Further, the invention is not limited by the quantities of the first mounting holes 101, the second mounting holes 102, the first damping components 200, the second damping components 300, the first fasteners 600 and the second fasteners 700. In other embodiments, the bearing assembly may include one first mounting hole, one second mounting hole, one first damping component, one second damping component, one first fastener and one second fastener.

According to the bearing assembly disclosed by above embodiments, the first fastener and the second fastener are fixed to the casing of the electronic device and are respectively disposed in the first mounting hole and the second mounting hole of the plate body, the first damping component and the second damping component are respectively disposed in the first mounting hole and the second mounting hole of the plate body, and the hardness of the first damping component is different from the hardness of the second damping component. Thus, with the help of the first damping component, the resonance vibration transferred to the electronic device via the first fastener and the second fastener can be effectively absorbed. Also, with the help of the second damping component whose hardness is different from the hardness of the first damping component, the impact transferred to the electronic device via the first fastener and the second fastener can be effectively absorbed. Therefore, the operation of the electronic device is prevented from being affected by such impact and resonance.

In addition, since the damping pad is stacked on the plate body of the bearing assembly and is located between the casing of the electronic device and the plate body of the bearing assembly, the damping pad can further absorb the impact transferred to the electronic device via the first fastener and the second fastener. That is, through the cooperation of the damping pad and the second damping components, the impact transferred to the electronic device via the first fastener and the second fastener along various directions can be effectively absorbed.

In an embodiment of the invention, the technique disclosed by the invention can be applied to vehicles, such as autonomous vehicles (AV), electric vehicles, or a vehicle equipped with an advanced driver assistance systems (ADAS).

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A bearing assembly, configured to be disposed on a casing of an electronic device, the bearing assembly comprising:
    a plate body, comprising a first mounting hole and a second mounting hole;
    a first damping component, disposed in the first mounting hole, the first damping component comprising a first hole;
    a second damping component, disposed in the second mounting hole, the second damping component comprising a second hole;
    a first fastener, disposed in the first hole of the first damping component and configured to be fixed to the casing of the electronic device; and
    a second fastener, disposed in the second hole of the second damping component and configured to be fixed to the casing of the electronic device;
    wherein a hardness of the first damping component is greater than a hardness of the second damping component; and
    wherein the first mounting hole is a cylindrical hole and the second mounting hole is a pear-shaped hole.

2. The bearing assembly according to claim 1, wherein the second mounting hole comprises a wider portion and a narrower portion that are connected to each other, a diameter of the wider portion is greater than a diameter of the narrower portion, a maximum diameter of the second damping component is between the diameter of the wider portion and the diameter of the narrower portion, and the second fastener is disposed in the narrower portion of the second mounting hole.

3. The bearing assembly according to claim 1, further comprising a damping pad, wherein the damping pad is stacked on the plate body and configured to be located between the casing of the electronic device and the plate body.

4. The bearing assembly according to claim 3, wherein a hardness of the damping pad is less than a hardness of the first damping component.

5. The bearing assembly according to claim 1, further comprising a first positioning pillar and a second positioning pillar, wherein the first positioning pillar is disposed in the first hole of the first damping component, the second positioning pillar is disposed in the second hole of the second damping component, the first fastener is fastened to the first positioning pillar, the second fastener is fastened to the second positioning pillar, the first positioning pillar and the second positioning pillar are configured to be fixed to the casing of the electronic device.

6. The bearing assembly according to claim 5, wherein the first fastener includes a threaded portion and an unthreaded portion, the threaded portion is connected to the unthreaded portion and a width of the threaded portion is less than a width of the unthreaded portion, the threaded portion is screwed into the first positioning pillar, and the first damping component is clamped by the unthreaded portion and a wall surface of the plate body that forms the first mounting hole.

7. The bearing assembly according to claim 6, further comprising a pad, wherein the pad is clamped by the unthreaded portion and the first positioning pillar, the first fastener further comprises a blocking portion, the blocking portion radially protrudes from the unthreaded portion, and the first damping component is clamped by the pad and the blocking portion.

8. The bearing assembly according to claim 1, wherein the second damping component further comprises an engagement recess spaced apart from the second hole, and the plate body is engaged with the engagement recess.

9. The bearing assembly according to claim 1, wherein quantities of the first mounting hole, the second mounting hole, the first fastener, the second fastener, the first damping component and the second damping component are plural, the plurality of first damping components are respectively disposed in the plurality of first mounting holes, the plurality of second damping components are respectively disposed in the plurality of second mounting holes, the plurality of first fasteners are respectively disposed in the plurality of first holes of the plurality of first damping components, and the plurality of second fasteners are respectively disposed in the plurality of second holes of the plurality of second damping components; and
    the plurality of second mounting holes are arranged side by side in an array, the plurality of first mounting holes are respectively located between two adjacent rows of the plurality of second mounting holes, and the plurality of first mounting holes are respectively arranged side by side in two outermost columns of the plurality of second mounting holes.

* * * * *